US010304742B2

(12) United States Patent
Cheng et al.

(10) Patent No.: US 10,304,742 B2
(45) Date of Patent: May 28, 2019

(54) FORMING INSULATOR FIN STRUCTURE IN ISOLATION REGION TO SUPPORT GATE STRUCTURES

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/680,711

(22) Filed: Aug. 18, 2017

(65) Prior Publication Data

US 2017/0372970 A1 Dec. 28, 2017

Related U.S. Application Data

(63) Continuation of application No. 15/177,917, filed on Jun. 9, 2016, now Pat. No. 9,870,948.

(51) Int. Cl.
*H01L 21/762* (2006.01)
*H01L 21/8234* (2006.01)
(Continued)

(52) U.S. Cl.
CPC .. *H01L 21/823431* (2013.01); *H01L 21/3081* (2013.01); *H01L 21/76224* (2013.01);
(Continued)

(58) Field of Classification Search
CPC ....... H01L 21/76224; H01L 21/823425; H01L 21/823481; H01L 29/6681; H01L 29/7851;
(Continued)

(56) References Cited

U.S. PATENT DOCUMENTS 6,864,164 B1 * 3/2005 Dakshina-Murthy ....................... H01L 29/66545
257/E21.444
6,943,405 B2 9/2005 Bryant et al.
(Continued)

OTHER PUBLICATIONS

List of IBM Patents or Patent Applications Treated as Related dated Aug. 18, 2017, 2 pages.
(Continued)

*Primary Examiner* — Nathan W Ha
(74) *Attorney, Agent, or Firm* — Tutunjian & Bitetto, P.C.; Vazken Alexanian

(57) ABSTRACT

A method for forming the semiconductor device that includes forming a plurality of composite fin structures across a semiconductor substrate including an active device region and an isolation region. The composite fin structures may include a semiconductor portion over the active device region and a dielectric portion over the isolation region. A gate structure can be formed on the channel region of the fin structures that are present on the active regions of the substrate, and the gate structure is also formed on the dielectric fin structures on the isolation regions of the substrate. Epitaxial source and drain regions are formed on source and drain portions of the fin structures present on the active region, wherein the dielectric fin structures support the gate structure over the isolation regions.

20 Claims, 3 Drawing Sheets

(51) Int. Cl.
*H01L 29/66* (2006.01)
*H01L 29/78* (2006.01)
*H01L 21/308* (2006.01)
*H01L 27/088* (2006.01)
*H01L 29/06* (2006.01)
*H01L 29/08* (2006.01)

(52) U.S. Cl.
CPC ............ *H01L 21/823468* (2013.01); *H01L 21/823481* (2013.01); *H01L 27/0886* (2013.01); *H01L 29/0649* (2013.01); *H01L 29/0847* (2013.01); *H01L 29/6681* (2013.01); *H01L 29/66545* (2013.01); *H01L 29/7851* (2013.01)

(58) Field of Classification Search
CPC ......... H01L 21/823431; H01L 21/3081; H01L 21/823468
See application file for complete search history.

(56) References Cited

U.S. PATENT DOCUMENTS

| | | | |
|---|---|---|---|
| 7,198,995 B2 * | 4/2007 | Chidambarrao | ............................ H01L 21/823807 257/E21.633 |
| 8,053,299 B2 | 11/2011 | Xu | |
| 9,087,897 B1 | 7/2015 | Anderson et al. | |
| 9,153,693 B2 | 10/2015 | Yu et al. | |
| 9,362,383 B1 * | 6/2016 | Balakrishnan | ...... H01L 29/6653 |
| 9,379,116 B1 * | 6/2016 | Kim | .................. H01L 27/10879 |
| 9,620,416 B1 | 4/2017 | Basker et al. | |
| 9,748,381 B1 | 8/2017 | Bi et al. | |
| 2011/0101455 A1 * | 5/2011 | Basker | .............. H01L 21/26586 257/347 |
| 2013/0154006 A1 | 6/2013 | Basker et al. | |
| 2013/0307088 A1 | 11/2013 | Yang et al. | |
| 2014/0035045 A1 | 2/2014 | Alptekin et al. | |
| 2014/0117454 A1 | 5/2014 | Liu et al. | |
| 2014/0203362 A1 | 7/2014 | Kim et al. | |
| 2014/0327074 A1 * | 11/2014 | Tsao | ..................... H01L 27/0886 257/337 |
| 2015/0061024 A1 * | 3/2015 | Li | .......................... H01L 27/088 257/368 |
| 2015/0279947 A1 | 10/2015 | Waldron et al. | |
| 2015/0318281 A1 | 11/2015 | Cheng et al. | |
| 2015/0333145 A1 * | 11/2015 | Chudzik | ........... H01L 29/66795 257/401 |
| 2015/0333155 A1 * | 11/2015 | Liu | ................... H01L 29/66545 257/401 |
| 2015/0340302 A1 * | 11/2015 | Chen | ................... H01L 23/3171 257/190 |
| 2015/0340452 A1 * | 11/2015 | Xie | ....................... H01L 29/785 257/401 |
| 2015/0340468 A1 * | 11/2015 | Lim | .................. H01L 29/66795 438/283 |
| 2015/0364578 A1 | 12/2015 | Liu et al. | |
| 2016/0027875 A1 | 1/2016 | Kim et al. | |
| 2016/0293413 A1 | 10/2016 | Duriez et al. | |
| 2016/0293760 A1 | 10/2016 | Glass et al. | |
| 2017/0194155 A1 * | 7/2017 | Anderson | ......... H01L 21/28518 |

OTHER PUBLICATIONS

U.S. Office Action issued in U.S. Appl. No. 15/443,451, dated Feb. 23, 2018, pp. 1-11.
U.S. Final Office Action issued in U.S. Appl. No. 15/443,451, dated Aug. 3, 2018, pp. 1-7.

* cited by examiner

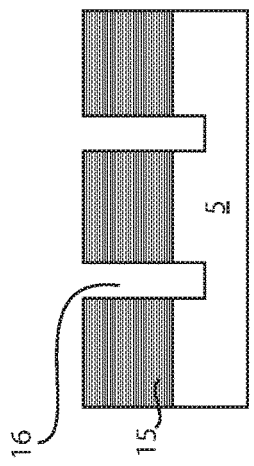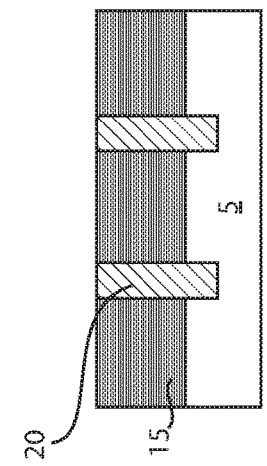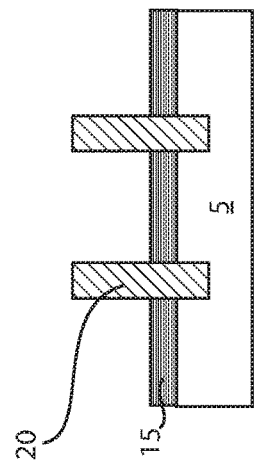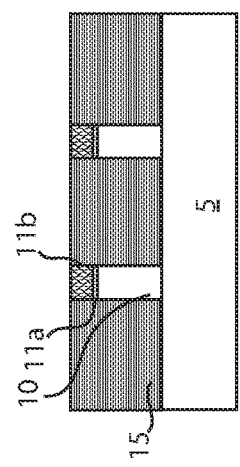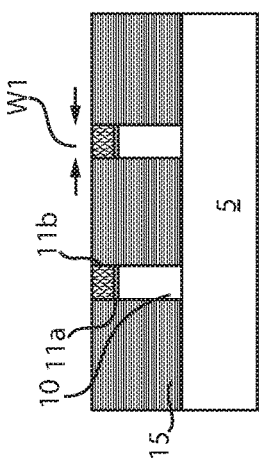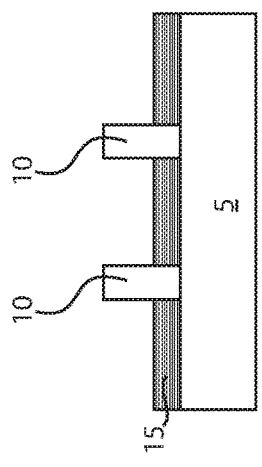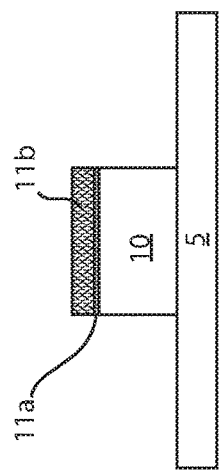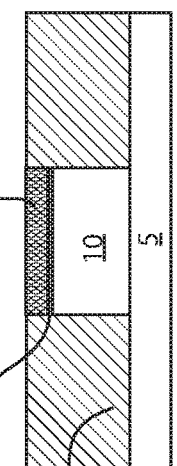

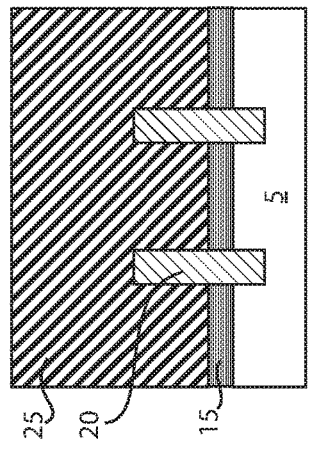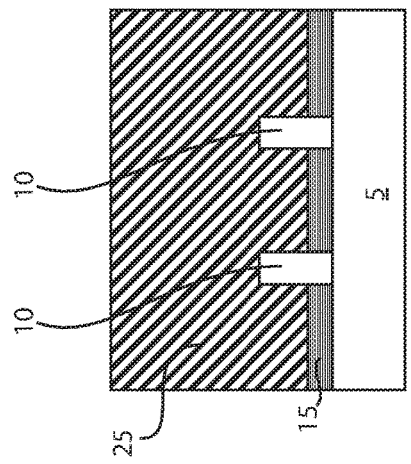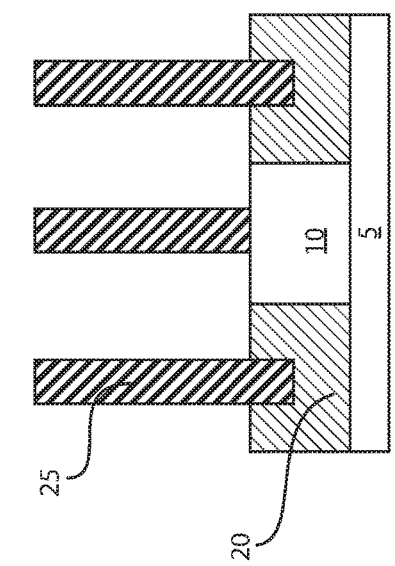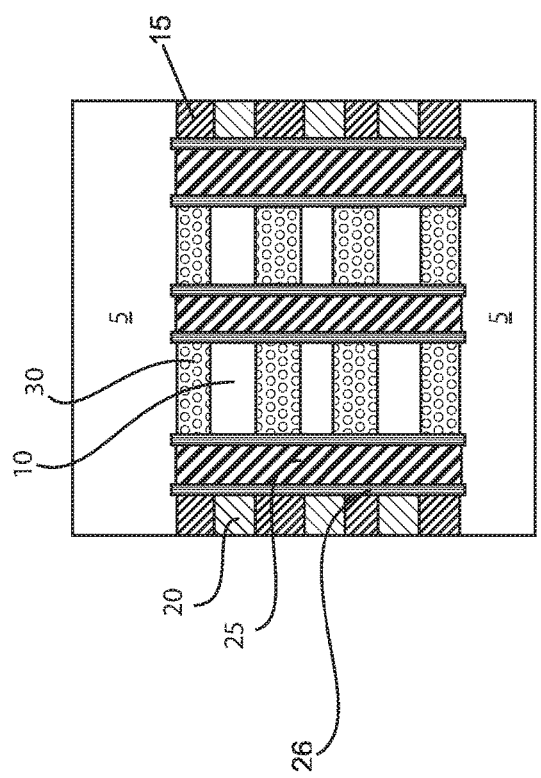

FORMING INSULATOR FIN STRUCTURE IN ISOLATION REGION TO SUPPORT GATE STRUCTURES

BACKGROUND

Technical Field

The present disclosure relates to field effect transistors (FETs), and more specifically, to FETs including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, the present disclosure provides field effect transistors including fin structures using a method that employs a dielectric fin structure to support gate structures of the isolation regions of a semiconductor substrate. In one embodiment, the method includes forming a plurality of fin structures across a semiconductor substrate including an active device region and an isolation region. The method may further include forming a hardmask dielectric on the semiconductor substrate contacting the fin structure sidewalls, wherein an upper surface of the fin structures is exposed. Portions of the fin structures present on the isolation regions of the substrate may be removed to form fin trenches having sidewalls defined by the hard mask, while portions of the fin structures present on the active regions of the substrate remain. A dielectric fin is formed in the fin trenches adjacent to the portion of the fin structures present on the active regions of the substrate. Gate structures are formed on the channel region of the fin structures present on the active regions of the substrate and the dielectric fin on the isolation regions. Epitaxial source and drain regions are formed on source and drain portions of the fin structures present on the active region, wherein the dielectric fin structures support the gate structure over the isolation regions.

In another embodiment, the method for forming the semiconductor device may include forming a plurality of composite fin structures across a semiconductor substrate including an active device region and an isolation region. The composite fin structures may include a semiconductor portion over the active device region and a dielectric portion over the isolation region. A gate structure can be formed on the channel region of the fin structures that are present on the active regions of the substrate, and the gate structure is also formed on the dielectric fin structures on the isolation regions of the substrate. Epitaxial source and drain regions are formed on source and drain portions of the fin structures present on the active region, wherein the dielectric fin structures support the gate structure over the isolation regions.

In another aspect, a semiconductor device is provided including composite fin structure including semiconductor and dielectric portions. In one embodiment, the semiconductor device comprises a composite fin structure including semiconductor fin portions on an active device region of a semiconductor substrate and dielectric fin portions on isolation regions of the semiconductor substrate. The semiconductor fin portions are in direct contact with the dielectric fin portions. The semiconductor device may further include a gate structure present on a channel region portion of the composite fin structure. Epitaxial source and drain regions may be present on the source and drain region portions of the composite fin structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2A is a side-cross sectional view through the length of a fin structure (similar to a cross-section along section line A-A in FIG. 1) depicting a device processing step that includes using an etch mask to remove the fin structures from over the isolation region of the substrate forming fin trenches, in accordance with one embodiment of the present disclosure.

FIG. 2B is a side cross-sectional view through a gate structure region (similar to a cross-section along section line B-B in FIG. 1) that is overlying an active region of the substrate depicting the device process step illustrated in FIG. 2A.

FIG. 2C is a side cross-sectional view through a gate structure region (similar to a cross-section along section line C-C in FIG. 1) that is overlying an isolation region of the substrate depicting the device process step illustrated in FIG. 2A.

FIG. 3A is a side-cross sectional view through the length of a fin structure (similar to a cross-section along section line A-A in FIG. 1) depicting a device processing step that includes filling the fin trenches that are present over the isolation regions in the substrate with a dielectric material to form dielectric fin portions, in accordance with one embodiment of the present disclosure.

FIG. 3B is a side cross-sectional view through a gate structure region (similar to a cross-section along section line B-B in FIG. 1) that is overlying an active region of the substrate depicting the device process step illustrated in FIG. 3A.

FIG. 3C is a side cross-sectional view through a gate structure region (similar to a cross-section along section line C-C in FIG. 1) that is overlying an isolation region of the substrate depicting the device process step illustrated in FIG. 3A.

FIG. 4A is a side-cross sectional view through the length of a fin structure (similar to a cross-section along section line A-A in FIG. 1) depicting a device processing step that includes recessing the dielectric layer adjacent to the fin structures with an etch that is selective to the remaining semiconductor portions of the fin structures and the dielectric portions of the fin structures, in accordance with one embodiment of the present disclosure.

FIG. 4B is a side cross-sectional view through a gate structure region (similar to a cross-section along section line B-B in FIG. 1) that is overlying an active region of the substrate depicting the device process step illustrated in FIG. 4A.

FIG. 4C is a side cross-sectional view through a gate structure region (similar to a cross-section along section line C-C in FIG. 1) that is overlying an isolation region of the substrate depicting the device process step illustrated in FIG. 4A.

FIG. 5A is a side-cross sectional view through the length of a fin structure (similar to a cross-section along section line A-A in FIG. 1) depicting a device processing step that includes forming gate structures on the semiconductor portions of the fin structures and the dielectric portions of the fin structures, in accordance with one embodiment of the present disclosure.

FIG. 5B is a side cross-sectional view through a gate structure region (similar to a cross-section along section line B-B in FIG. 1) that is overlying an active region of the substrate depicting the device process step illustrated in FIG. 5A.

FIG. 5C is a side cross-sectional view through a gate structure region (similar to a cross-section along section line C-C in FIG. 1) that is overlying an isolation region of the substrate depicting the device process step illustrated in FIG. 5A.

FIG. 6 is a top down view depicting forming epitaxial source and drain regions on source and drain portions of the fin structures present on the active region, wherein the dielectric fin structures support the gate structure over the isolation regions of the substrate, in accordance with one embodiment of the present disclosure.

DETAILED DESCRIPTION OF PREFERRED EMBODIMENTS

Figure 1C:
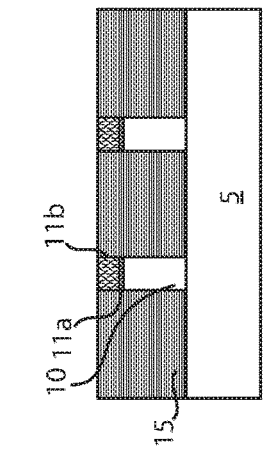
FIG. 1C is a side cross-sectional view through a gate structure region (similar to a cross-section along section line C-C in FIG. 1) that is overlying an isolation region of the substrate depicting the device process step illustrated in FIG. 1A.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A "gate structure" means a structure used to control output current (i.e., flow of carriers in the channel) of a semiconducting device through electrical or magnetic fields. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

In some embodiments, the methods, compositions and structures disclosed herein support gate structures formed overlying fin structures in isolation regions of semiconductor substrates. It has been determined that in some forms of semiconductor processing, such as epitaxial growth processes, semiconductor fin structures that overlying dielectric isolation regions can be etched, which can undercut a gate structure (functional gate structure and/or dummy gate structure) that is present thereon causing the gate structure to lift off of the substrate. The incidence of lift off of a gate structure may be referred to as "gate flop over". The methods and structures of the present disclosure are now discussed with more detail referring to FIGS. 1-6.

Figure 1:
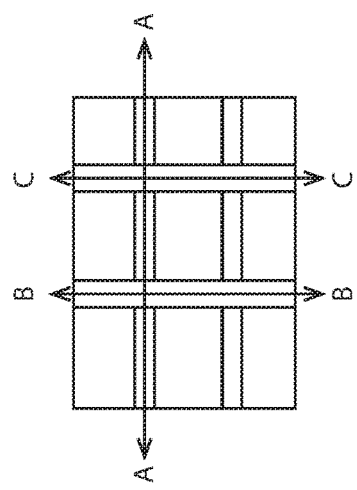
FIG. 1 is a top down view of a semiconductor device illustrating cross-sections of a fin type field effect (FinFET) device geometry, in which section line A-A illustrates a cross-section through a length of a fin structure, section line B-B illustrates a cross-section through a gate structure present over an active device region of a semiconductor substrate, and section line C-C illustrates a cross-section through a gate structure present over an isolation region of a semiconductor substrate

FIGS. 1-1C depict one embodiment of forming a plurality of fin structures 10 and forming a dielectric layer 15 adjacent to the fin structures 10, in which the dielectric layer 15 has an upper surface substantially coplanar with an upper surface of the fin structures 10. The fin structures 10 may also be referred to as this stage of the device processing as semiconductor fin structure 10 and the dielectric layer 15 may also be referred to as a hardmask dielectric layer 15.

In some embodiments, the fin structures 10 may be formed from a bulk semiconductor substrate 5. In some embodiments, the semiconductor substrate 5 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon. In other embodiments, the semiconductor substrate 5 may be composed of a type III-V semiconductor substrate. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 5 may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. Although the semiconductor substrate 5 is described herein as a bulk semiconductor substrate, the semiconductor substrate 5 may also be a semiconductor on insulator (SOI) substrate, such as a silicon (Si) layer overlying a buried oxide layer.

The portions of the semiconductor substrate 5 that are underlying the fin structures 10 may be referred to as the active region of the substrate, and the portions of the semiconductor substrate 5 that are separating the adjacent fin structures 10 and do not provide the location for the subsequently formed source and drain regions or the gate structure may be referred to as the isolation regions 6.

The fin structures 10, i.e., semiconductor fin structures 10, may be formed from the semiconductor substrate 5 using deposition, photolithography and etch processes. The semiconductor layer 5 may be composed of a type IV semiconductor material or a type III-V semiconductor material. Any of the aforementioned examples of type IV and/or type III-V semiconductor materials that have been described above for the semiconductor substrate 5 may be suitable for the semiconductor layer that is deposited atop the semiconductor substrate 5 for forming the fin structures 5. For example, the fin structures 10 may be composed of silicon, germanium, silicon germanium, indium gallium arsenide, other type III-V compound semiconductors and combinations thereof.

In one embodiment, the patterning process used to define each of the fin structures 10 is a sidewall image transfer (SIT) process. The SIT process can include forming a mandrel material layer (not shown) on the portions of the semiconductor substrate 5 that provides the fin structures 10. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the portion of the semiconductor substrate 5 that provides the fin structures 10. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. In some embodiments, the etch process may be an etch process including a chemistry that is selective to the semiconductor substrate 5 and the isolation regions 6. The etching steps pattern the semiconductor substrate 5 to provide the fin structures 10. Following etching, i.e., pattern transfer, the SIT process may conclude with removing the dielectric spacers using an etch process or a planarization process.

It is noted that the aforementioned spacer image transfer (SIT) process is only one method of forming the fin structures 10. In another embodiment, each of the fin structures 10 may be formed using a photoresist etch mask.

In some embodiments, a fin dielectric cap 11a, 11b may be present atop the fin structures 10. Any dielectric material may be present in the fin dielectric cap 11a, 11b. For example, a first dielectric layer 11a may be provided by an oxide, e.g., silicon oxide, that is present atop the semiconductor surface of the fin structure 10, and a second dielectric layer 11b, such as a silicon nitride, may be present atop the first dielectric layer 11a.

Each of the fin structures 10 may have a height H1 ranging from 5 nm to 200 nm. In another embodiment, each of the fin structures 10 has a height H1 ranging from 10 nm to 100 nm. In one example, each of the fin structures 10 has a height H1 ranging from 20 nm to 50 nm. Each of the fin structures 10 may have a width W1 of less than 15 nm. In another embodiment, each of the fin structures 10 has a width W1 ranging from 3 nm to 8 nm. In some embodiments, the pitch, i.e., center to center, distance separating adjacent fin structures 10 may range 35 nm to 45 nm. In another example, the pitch separating adjacent fin structures 10 may range from 30 nm to 40 nm.

As depicted in the supplied figures a portion of at least one fin structure 10 is present overlying an isolation region of the substrate, and at least a portion of the fin structure 10 is present over the active region of the substrate.

Figure 1B:
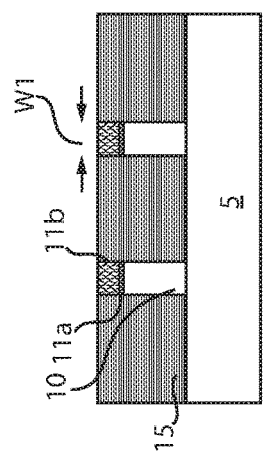
FIG. 1B is a side cross-sectional view through a gate structure region (similar to a cross-section along section line B-B in FIG. 1) that is overlying an active region of the substrate depicting the device process step illustrated in FIG. 1A.
Figure 1A:
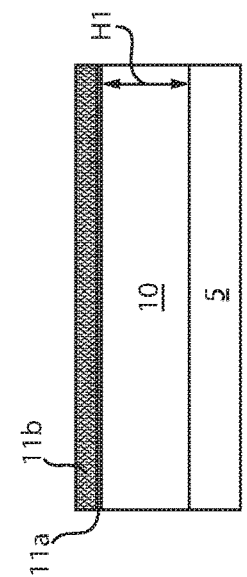
FIG. 1A is a side-cross sectional view through the length of a fin structure (similar to a cross-section along section line A-A in FIG. 1) depicting a device processing step that includes forming a plurality of fin structures and forming a dielectric layer adjacent to the fin structures, in which the dielectric layer has an upper surface substantially coplanar with an upper surface of the fin structures, in accordance with one embodiment of the present disclosure.

FIGS. 1A-1B also depict forming a hardmask dielectric 15 on the semiconductor substrate 5 at least contacting the sidewalls of the fin structures 10. The hardmask dielectric 15 is typically deposited on the semiconductor substrate and the fin structures 10, wherein the portion of the hardmask dielectric 15 that is formed over the top of the fin structures 10 is removed to expose the fin structure's upper surface. The dielectric material that is deposited to form the hardmask dielectric 15 may be an oxide, such as silicon oxide, or a nitride, such as silicon nitride. The dielectric material that provides the hardmask dielectric 15 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes that are suitable for forming the dielectric material that provides the hardmask dielectric 15 may include, but is not limited to, Atmospheric Pressure CVD (APCVD), Low Pressure CVD (LPCVD), Plasma Enhanced CVD (PECVD), Metal-Organic CVD (MOCVD) and combinations thereof may also be employed. The thickness of the hardmask dielectric 15 is selected to reach at least the height of the fin structures 10. In some embodiments, the thickness of the hardmask dielectric 15 exceeds the height of the fin structures 10, in which following deposition the hardmask dielectric 15 is then planarized so that the upper surface of the hardmask dielectric 15 is coplanar with the upper surface of the fin structures 10. A planarization process, such as chemical-mechanical polishing (CMP), may optionally be used to provide a planar structure.

FIGS. 2A-2C depict one embodiment of removing portions of the fin structures 10 from over the isolation region of the substrate 5. The portions of the fin structures 10 that are present over the isolation regions may be removed by forming an etch mask over the portions of the fin structures 10 that are present over the active region of the substrate 5, and etching the exposed portions of the fin structure 10 that are present over the isolation regions. In some embodiments, the etch mask may be a photoresist mask. To provide the photoresist mask, a photoresist layer is first positioned the upper surfaces of the hardmask dielectric 15 and the fin structures 10. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. The developed photoresist mask is present over the portions of the fin structures 10 overlying the active portion of the substrate 5 leaving the portions of the fin structures 10 that are overlying the isolation regions of the substrate 5 to be removed exposed.

The exposed portion of the fin structures 10 may be etched using an etch process that is selective to at least the photoresist mask. The etch process for removing the exposed portions of the fin structures 10 may also be selective to the hardmask dielectric 15. The term "selective" as used to describe a material removal process denotes that the rate of material removal for a first material is greater than the rate of removal for at least another material of the structure to which the material removal process is being applied. In some embodiments, the etch process for removing the portions of the fin structure 10 that are overlying the isolation regions may be an anisotropic etch process, such as reactive ion etching (RIE). In other embodiments, the etch process for removing the portions of the fin structures 10 that are overlying the isolation regions of the substrate 5 may be an isotropic etch, such as a wet chemical etch. Removing the portions of the fin structure 10 that are overlying the isolation regions 6 with an etch that is selective to the hardmask dielectric 15 forms fin trenches 16 having sidewalls defined by the hardmask dielectric 15 and a base defined by the isolation region portion of the substrate 5.

FIGS. 3A-3C depict a device processing step that includes filling the fin trenches 16 that are present over the isolation regions in the substrate 17 with a dielectric material to form dielectric fin portions 20. The dielectric fin portions 20 are typically composed of any dielectric material. For example, the dielectric fin portions 20 may be composed of an oxide, nitride or oxynitride material. One example of an oxide that is suitable for the dielectric fin portions 20 is silicon oxide. One example of a nitride that is suitable for the dielectric fin portions 20 is silicon nitride. In some embodiments, the dielectric fin portions 20 may be composed of a low-k dielectric. As used herein, the term "low-k" denotes a dielectric material having a dielectric constant equal to the dielectric constant of silicon oxide ($SiO_2$) or less. The low-k dielectric material for the dielectric fin portions 20 may typically have a dielectric constant that is less than 7.0, e.g., 5.5. In one embodiment, the low-k dielectric material for the dielectric fin portions 20 has a dielectric constant ranging from 3.9 to 6. In another embodiment, the low-k dielectric material for the dielectric fin portions 20 has a dielectric constant less than 3.9. Examples of materials suitable for the dielectric fin portions 20 include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. In one embodiment, the dielectric fin portions 20 may be composed of silicon boron carbon nitride (SiBCN).

The dielectric material for forming the dielectric fin portions 20 may be deposited in the fin structures 16 using a deposition process, such as chemical vapor deposition (CVD), e.g., plasma enhanced chemical vapor deposition, metal organic chemical vapor deposition or a combination thereof. Following filling of the fin trenches 16, the structure may be planarized using chemical mechanical planarization.

In some embodiments, the dielectric fin portions 20 will have the same width as the portions of the fin structure 10 that are overlying the active region of the substrate 5. The dielectric fin trenches 16 are formed using the original fin structures 10, i.e., the hardmask dielectric material is formed abutting the original fin structures over the isolation regions, wherein following removal of the portions of the fin structure 10 over the isolation regions the dielectric fin trenches 16 have a width substantially the same as the width of the fin structures 10. Thereafter, when the dielectric material for the dielectric fin portions 20 is deposited in the fin trenches 16, the dielectric fin potions 20 have a width defined by the fin trenches 16, which is substantially equal to the remaining portions of the fin structures 10 that are overlying the active region of the substrate 5.

FIGS. 4A-4C depict recessing the dielectric layer, i.e., hardmask dielectric layer 15, with an etch that is selective to the remaining semiconductor portions of the fin structures 10 and the dielectric fin portions 20. The hardmask dielectric layer 15 may be recessed with an etch that removes the material of the hardmask dielectric layer 16, e.g., silicon oxide ($SiO_2$), selectively to the material of the remaining semiconductor portions of the fin structure, e.g., silicon (Si) fin structures, and the dielectric fin portions 20, e.g., silicon carbon boron nitride (SiBCN) portions, of the fin structures. In one embodiment, the etch process for recessing the hardmask dielectric layer 16 is an anisotropic etch process, such as reactive ion etch (RIE), plasma etching, ion beam etching or laser ablation/etching. In other embodiments, the etch process for recessing the hardmask dielectric is an isotropic etch, e.g., wet chemical etch. The hardmask dielectric layer 16 is recessed to the depth that provides the height of the fin structures, e.g., fin structures 10 over the active regions of the substrate that provides the channel region of the device. The remaining portions of the hardmask dielectric layer 16 may provide for isolation between adjacently positioned fin structures 10. Because the remaining portions of the hard mask dielectric layer 16 provide shallow trench isolation (STI) regions, the hardmask dielectric layer 16 may be referred to as a material layer for a shallow trench isolation region or an STI dielectric layer.

FIGS. 5A-5C depict one embodiment of forming gate structures 25 on the semiconductor portions of the fin structures 10 and the dielectric fin portions 20. The gate structure 25 typically includes at least a gate dielectric that is present on the channel region the fin structures 10, and dielectric fin portions 20, and a gate electrode that is present on the gate dielectric. In one embodiment, the at least one gate dielectric layer includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm.

The conductive material of the gate electrode may comprise polysilicon, SiGe, a silicide, a metal or a metal-silicon-nitride such as Ta—Si—N. Examples of metals that can be used as the gate electrode include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing. In yet another embodiment, when the fin structure 10 is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

In yet another embodiment, when the fin structure 10 is being employed in an n-FinFET, the gate electrode may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TaN, TiN, HfN, HfSi, or combinations thereof.

The gate structure 25 may be formed by using a deposition method, such as a chemical vapor deposition method and/or a physical vapor deposition (PVD), to deposit the material layers for the at least one gate dielectric layer and the at least one gate electrode followed by photolithography and etch processing.

In some embodiments, a gate sidewall spacer 26 can be formed on the sidewall of the gate structure 25, as depicted in FIG. 6. In one embodiment, the gate sidewall spacer 26 may be formed by using a blanket layer deposition process, such as CVD, and an anisotropic etchback method. The gate sidewall spacer 26 may have a width ranging from 2.0 nm to 15.0 nm, and may be composed of a dielectric, such as a nitride, oxide, oxynitride, or a combination thereof.

FIG. 6 further depicts one embodiment of forming source regions and drain regions 30 on the source and drain region portions of the fin structures 10 that are present on opposing sides of the fin structure's channel region over the active region of the substrate 5. The conductivity type, i.e., whether n-type or p-type, of the source and drain regions 30 typically dictate the conductivity type of the semiconductor device, i.e., whether the semiconductor device is n-type or p-type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

The source and drain regions 30 typically include an epitaxial semiconductor material that is formed on the source and drain region portions of the fin structures 10. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD).

The epitaxial semiconductor material for the source and drain regions 30 may be a type IV semiconductor, such as silicon (Si), silicon germanium (SiGe), germanium (Ge), silicon doped with carbon (Si:C). Examples of silicon containing precursors used to form source and drain regions 30 including a base material of silicon (Si) may include hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H4$) and combinations thereof. In some embodiments, in which the epitaxial semiconductor material for the source and drain regions 30 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In other embodiments, the epitaxial semiconductor material for the source and drain regions 30 may be at type III-V compound semiconductor material, such as gallium arsenide (GaAs).

The epitaxial semiconductor material may be doped to the conductivity type of the source and drain region 30. The dopant may be introduced to the epitaxial semiconductor material using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, extension source and drain regions may be formed in the source and drain region portions of the fin structure 10 by thermally diffusing the dopant from the epitaxial semiconductor material into the active portion of the fin structures 10. In some embodiments, the charge carrier type dopant in said source and drain region 30 is present in a concentration ranging from $1\times10^{20}$ dopants/$cm^3$ to $2\times10^{20}$ dopants/$cm^3$.

It has been determined that in prior semiconductor device manufacturing, in which a silicon (Si) fin structure was present over an isolation region, the interaction of the precursor gasses, i.e., epitaxial pre-clean process, from the epitaxial growth process with at least the oxide material of the shallow trench isolation regions (STI) regions will undercut the STI material to lift the gate structures resulting in flop over. Etching the isolation regions removes the supporting structure, i.e., fin structures, from the base of the gate structures that were extending over the isolation regions, which typically resulted in the gate structure lifting off of the substrate 5. The gate structures lifting off the substrate has also be referred to as "gate flop over". In the process flow described above, the portion of the fin structures 10 overlying the isolation regions has been replaced with a dielectric fin portion 20 that is etch resistant to the precursor gasses used in epitaxial growth processing. For example, the dielectric fin portion 20 may be composed of silicon carbon boron nitride (SiBCN).

It is noted that in the above examples, a gate first process has been described for forming the gate structure 25. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect of the present disclosure, a semiconductor device has been provided that includes fin structures composed of a dielectric material, i.e., dielectric fin portions 20, that are present over the isolation regions 5, wherein semiconductor fin portions 10 are present over the active device region of the substrate 5. The combination of the semiconductor fin portions 10 and the dielectric fin portions 20 provide a composite fin structure, in which the semiconductor fin portions 10 are in direct contact with the dielectric fin portions 20. A gate structure 25 is present on a channel region portion of the composite fin structure. Epitaxial source and drain regions on the source and drain region portions of the composite fin structure 10, 20. The semiconductor fin portions 10 of the composite fin structure have a same width as the dielectric fin portions 20 of the composite fin structure. In some embodiments, the semiconductor fin portions 10 are composed of a semiconductor material selected from the group consisting of silicon (Si), germanium (Ge), silicon germanium (SiGe), silicon doped with carbon (Si:C), type III-V semiconductors and combinations thereof. In some embodiments, the dielectric fin portions 20 are composed of a dielectric selected from the group consisting of silicon oxide, silicon oxynitride, aluminum oxide, hafnium oxide, silicon boron carbon nitride, and combinations thereof.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device comprising:
    removing portions of a plurality of fin structures that are present on isolation regions of a substrate to form fin trenches, wherein portions of the fin structures present on active regions of the substrate remain;
    forming a dielectric fin filling an entirety of a width and a height of the fin trenches adjacent to the portion of the fin structures present on the active regions of the substrate; and
    forming gate structures on the channel region of the fin structures present on at least the active regions of the substrate.

2. The method of claim 1, wherein the gate structures are also formed on the dielectric fin on the isolation regions.

3. The method of claim 2, further comprising forming epitaxial source and drain regions on source and drain portions of the fin structures present on the active regions, wherein the dielectric fin structures support the gate structure over the isolation regions.

4. The method of claim 1, wherein the plurality of fin structures are comprised of a semiconductor material selected from the group consisting of silicon (Si), germanium (Ge), silicon germanium (SiGe), silicon doped with carbon (Si:C), type III-V semiconductors and combinations thereof.

5. The method of claim 1, wherein forming said plurality of fin structures across the semiconductor substrate comprises spacer image transfer methods using a bulk substrate.

6. The method of claim 1, further comprising forming of the hardmask dielectric for patterning the fin structures comprising:

depositing a dielectric material for the hardmask dielectric over the fin structures; and
    planarizing the dielectric material for the hardmask dielectric so that the upper surface of the dielectric material is coplanar with the upper surface of the fin structures.

7. The method of claim 1, wherein said removing portions of the fin structures present on the isolation regions of the substrate to form the fin trenches comprises:
    forming an etch mask over the portions of the fin structures present on the active regions, wherein the portions of the fin structures over the isolation regions of the substrate are exposed; and
    etching the portions of the fin structures over the isolation regions of the substrate are exposed selectively to the etch mask.

8. The method of claim 1, wherein said forming the dielectric fin in the fin trenches comprises depositing a dielectric selected from the group consisting of silicon oxide, silicon oxynitride, aluminum oxide, hafnium oxide, silicon carbon boron nitride and combinations thereof.

9. A method for forming a semiconductor device comprising:
    forming a plurality of semiconductor fin structures across a semiconductor substrate including active regions and isolation regions;
    forming a hardmask dielectric on the semiconductor substrate contacting sidewalls of the semiconductor fin structure;
    removing portions of the semiconductor fin structures present on the isolation regions of the substrate to form fin trenches having sidewalls defined by a hard mask, wherein portions of the semiconductor fin structures present on the active regions of the substrate remain to provide the semiconductor fin portion;
    forming the dielectric fin portions filling an entirety of a width and a height of the fin trenches adjacent to the semiconductor fin portions present on the active regions of the substrate; and
    forming gate structures on a channel region of the semiconductor fin portions present on at least the active regions of the substrate.

10. The method of claim 9, wherein the semiconductor fin portions are comprised of a semiconductor material selected from the group consisting of silicon (Si), germanium (Ge), silicon germanium (SiGe), silicon doped with carbon (Si:C), type III-V semiconductors and combinations thereof.

11. The method of claim 9, wherein the dielectric fin portions are comprised of a dielectric selected from the group consisting of silicon oxide, silicon oxynitride, aluminum oxide, hafnium oxide, silicon boron carbon nitride, and combinations thereof.

12. The method of claim 9, further forming epitaxial source and drain regions on source and drain portions of the semiconductor fin portions present on the active region, wherein the dielectric fin portions are etch resistant to etchant chemicals of the precursors employed in the forming of epitaxial source and drain regions on source and drain portions of the fin structures.

13. The method of claim 12, wherein the epitaxial source and drain regions are merged source and drain regions extending into contact with the source and drain fin portions of adjacent fin structures.

14. The method of claim 13, wherein the epitaxial source and drain regions are comprised a semiconductor material selected from the group consisting of silicon (Si), germanium (Ge), silicon germanium (SiGe), silicon doped with carbon (Si:C), type III-V semiconductors and combinations thereof.

15. The method of claim 9, wherein the gate structures are present on the dielectric fin portions on the isolation regions.

16. A method for forming a semiconductor device comprising:
forming dielectric fin structures overlying an isolation region of a substrate, the dielectric fin structures aligned with and in contact with semiconductor fin structures present on the active regions of the substrate, wherein the dielectric fin structures fill an entirety of a width and a height of the fin trenches adjacent to the semiconductor fin structures; and
forming gate structures on the channel region of the semiconductor fin structures present on at least the active regions of the substrate, wherien the gate structures are also in contact with the dielectric fin structures.

17. The method of claim 16, further comprising forming epitaxial source and drain regions on source and drain portions of the semiconductor fin structures present on the active regions, wherein the dielectric fin structures support the gate structure over the isolation regions.

18. The method of claim 16, wherein the semiconductor fin structures are comprised of a semiconductor material selected from the group consisting of silicon (Si), germanium (Ge), silicon germanium (SiGe), silicon doped with carbon (Si:C), type III-V semiconductors and combinations thereof.

19. The method of claim 16, wherein said semiconductor fin structures are formed using spacer image transfer methods using a bulk substrate.

20. The method of claim 16, wherein the dielectric fin structures are comprised of a dielectric selected from the group consisting of silicon oxide, silicon oxynitride, aluminum oxide, hafnium oxide, silicon carbon boron nitride and combinations thereof.

* * * * *